United States Patent
Yu (10) Patent No.: US 7,633,136 B2
(45) Date of Patent: Dec. 15, 2009

(54) SEMICONDUCTOR DEVICE AND METHOD OF MANUFACTURING THE SAME

(75) Inventor: Man-Jong Yu, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 92 days.

(21) Appl. No.: 11/567,620

(22) Filed: Dec. 6, 2006

(65) Prior Publication Data

US 2007/0126077 A1    Jun. 7, 2007

(30) Foreign Application Priority Data

Dec. 7, 2005    (KR)    ...................... 10-2005-0118922

(51) Int. Cl.
*H01L 29/00* (2006.01)
(52) U.S. Cl. .................. 257/529; 257/209; 257/508; 257/665; 257/E23.147; 257/E23.149; 257/E23.15; 257/E21.592; 438/132; 438/467; 438/601
(58) Field of Classification Search ............... 257/529, 257/209, 508, 665, E21.592, E23.147, E23.149, 257/E23.15; 438/132, 467, 601
See application file for complete search history.

(56) References Cited

U.S. PATENT DOCUMENTS

| | | | |
|---|---|---|---|
| 6,172,896 B1 * | 1/2001 | Lee | 365/96 |
| 6,531,757 B2 * | 3/2003 | Shiratake | 257/529 |
| 6,541,290 B1 * | 4/2003 | Bang et al. | 438/22 |
| 6,597,054 B1 | 7/2003 | Prall et al. | |
| 6,822,309 B2 * | 11/2004 | Hirota | 257/529 |
| 7,057,217 B2 * | 6/2006 | Kang et al. | 257/209 |
| 7,361,967 B2 * | 4/2008 | Takahashi et al. | 257/529 |
| 2004/0140501 A1 * | 7/2004 | Kim | 257/328 |

FOREIGN PATENT DOCUMENTS

| | | |
|---|---|---|
| JP | 2000-357873 | 12/2000 |
| JP | 2002-151593 | 5/2002 |
| JP | 2005-032916 | 2/2005 |

OTHER PUBLICATIONS

English language abstract for Japanese Publication No. 2002-151593.
English language abstract for Japanese Publication No. 2005-032916.

* cited by examiner

*Primary Examiner*—Andy Huynh
(74) *Attorney, Agent, or Firm*—F. Chau & Associates, LLC (57) ABSTRACT

A semiconductor device includes an interlayer insulating film on a substrate. A runner part includes a plurality of runner lines spaced apart from each other by a regular interval under the interlayer insulating film. A fuse cut part includes a plurality of fuse lines spaced apart from each other by a wider interval than the interval between the runner lines. A via in the interlayer insulating film connects a fuse line and a runner line to each other.

15 Claims, 10 Drawing Sheets

SEMICONDUCTOR DEVICE AND METHOD OF MANUFACTURING THE SAME

CROSS-REFERENCE TO RELATED APPLICATION

This application claims benefit of foreign priority to Korean Patent Application No. 10-2005-0118922, filed on Dec. 7, 2005, the disclosure of which is incorporated herein by reference in its entirety.

BACKGROUND

1. Field of Invention

Embodiments exemplarily described herein relate generally to semiconductor devices and, more particularly, to semiconductor devices capable of preventing a repair failure.

2. Description of the Related Art

Generally, semiconductor devices are manufactured through a fabrication (FAB) process in which circuit patterns are repeatedly formed on substrates to form cells having integrated circuits, and an assembly process in which the substrates having the cells are packaged to form chips. Furthermore, an electrical die sorting (EDS) process is conducted between the fabrication process and the assembly process to inspect electrical properties of the cells formed on the substrate.

Inferior cells may be sorted out during the inspection process when electrical properties of the cells are examined. Since the sorted inferior cells are replaced by redundant cells that have been manufactured using a repair process, chips perform to requirements, and thus it is possible to improve the yield of a semiconductor device.

During a typical repair process, a laser beam is irradiated to a wire connected to the inferior cell in order to break the wire. The broken wire is called a fuse and a region where fuses are clustered together is called a fuse region. The fuse region may be formed at the same time that a word line or a bit line is formed in the cell region of the semiconductor device. However, in accordance with an increase in the integration density of the semiconductor device, if the fuse is formed in the word line or the bit line which is positioned at a relatively lower part of the semiconductor device, an etching depth is increased during a fuse open process. Accordingly, it has been recently proposed to use a metal wire or a conductive layer for electrodes of a capacitor, which is positioned at a relatively upper part of the semiconductor device, as a fuse.

Fuses may be of a linear-type or curved-type, depending on their shape. Curved-type fuses have a smaller area for the same pitch. Hence, the curved-type fuse is more frequently used than the linear-type fuse. However, when a curved-type fuse is divided into a cutting region and a non-cutting region, fuse fragments (i.e., portions of the fuse which are removed from the cutting region) may be dispersed onto non-cutting regions of other fuses within the fuse region. As a result, adjacent fuses may become electrically shorted together in the non-cutting regions thereof. Therefore, malfunction of the semiconductor device may occur, and the yield of semiconductor device may be reduced.

SUMMARY

Advantageous aspects of embodiments described herein provide semiconductor devices and associated manufacturing methods that are capable of preventing repair failures. These and other advantages will be apparent to those skilled in the art through the following description.

One embodiment exemplarily described herein can be characterized as a semiconductor device that includes an interlayer insulating film on a substrate; a runner part under the interlayer insulating film, the runner part including a plurality of runner lines spaced apart from each other by a first interval; a fuse cut part on the interlayer insulating film, the fuse cut part including a plurality of fuse lines spaced apart from each other by a second interval greater than the first interval; and a conductive via connecting one of the plurality of fuse lines to a corresponding one of the plurality of runner lines through the interlayer insulating film.

Another embodiment exemplarily described herein can be characterized as a semiconductor device that includes an interlayer insulating film on a substrate; a first runner part under the interlayer insulating film and a second runner part adjacent to the first runner part, the first and second runner parts including a plurality of runner lines spaced apart from each other by a first interval; a first fuse cut part on the interlayer insulating film and a second fuse cut part adjacent to the first fuse cut part, the first and second fuse cut parts including a plurality of fuse lines spaced apart from each other by a second interval greater than the first interval; and a conductive via connecting one of the plurality of fuse lines to a corresponding one of the plurality of runner lines through the interlayer insulating film.

Yet another embodiment exemplarily described herein can be characterized as a method of manufacturing a semiconductor device that includes forming a first interlayer insulating film on a substrate; forming a runner part on the first interlayer insulating film, the runner part including a plurality of runner lines spaced apart from each other by a first interval; forming a second interlayer insulating film on the runner part; forming a conductive via within the second interlayer insulating film, wherein the conductive via is connected to one of the plurality of runner lines; and forming a fuse cut part on the second interlayer insulating film, the fuse cut part including a plurality of fuse lines spaced apart from each other by a second interval greater than the first intervals, wherein one of the plurality of fuse lines is connected to the conductive via.

BRIEF DESCRIPTION OF THE DRAWINGS

The above and other features and advantages will become apparent by describing in detail exemplary embodiments with reference to the attached drawings in which.

DETAILED DESCRIPTION

Advantages and features of embodiments of the present invention and methods of accomplishing the same may be understood more readily by reference to the following detailed description of exemplary embodiments and the accompanying drawings. Embodiments described herein may, however, be realized in many different forms and should not be construed as being limited to the specific description set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

Embodiments of the present invention will be described with reference to sectional views and/or plan views shown in the FIGS. Thus, the profile of an exemplary view may be modified according to manufacturing techniques and/or allowances. That is, the embodiments of the invention are not intended to be limiting in scope but, rather, to cover all changes and modifications that can be caused due to a change in the manufacturing processes. For example, while an etched region is shown in a rectangular shape, it may be rounded or have a predetermined curvature. Thus, regions shown in the drawings are illustrated in schematic form and the shapes of the regions are presented simply by way of illustration and not as a limitation.

A structure of a semiconductor device according to one embodiment will be exemplarily described with reference to FIGS. 1 to 3.

Figure 1:
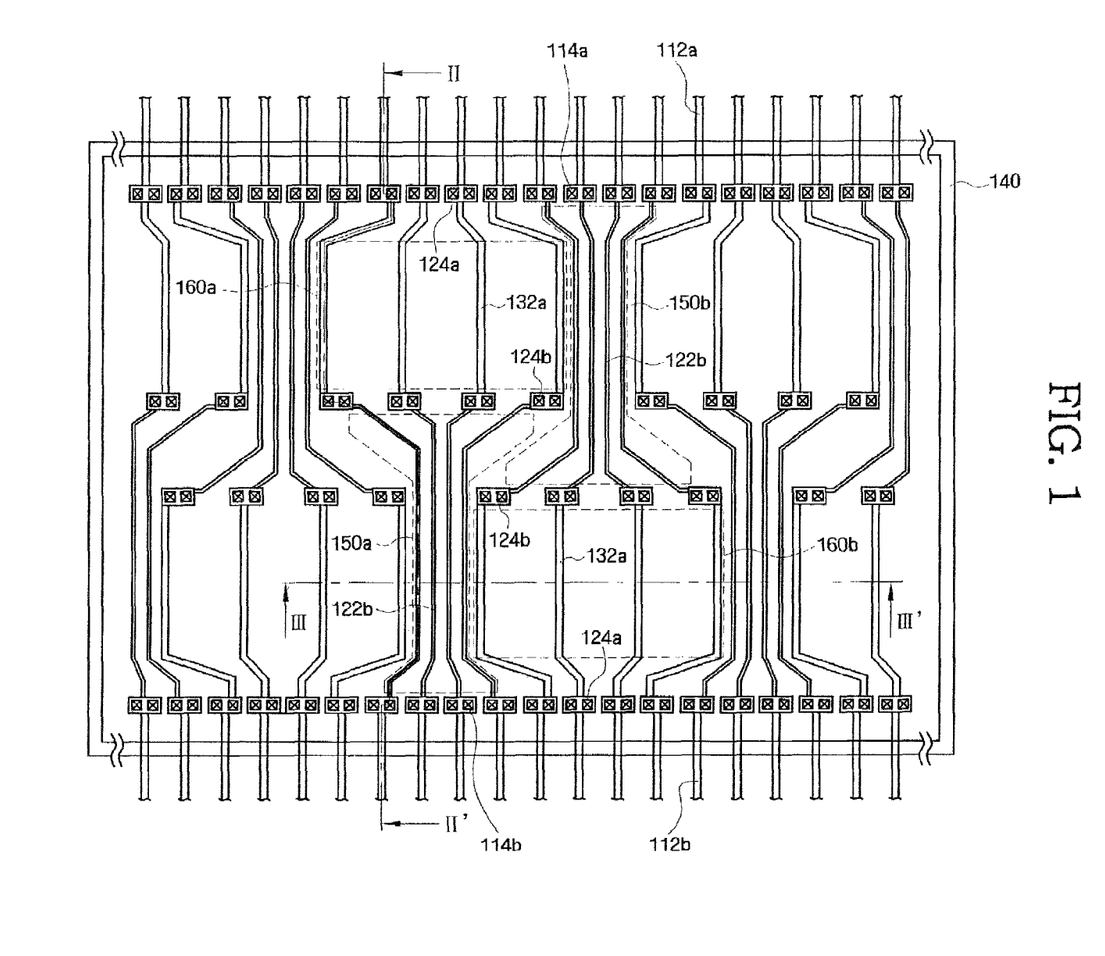
FIG. 1 is a plan view of one embodiment of a semiconductor device.

FIG. 1 is a plan view of one embodiment of a semiconductor device. FIG. 2 is a sectional view of the semiconductor device shown in FIG. 1, taken along the line II-II'. FIG. 3 is a sectional view of the semiconductor device shown in FIG. 1, taken along the line III-III'.

Figure 2:
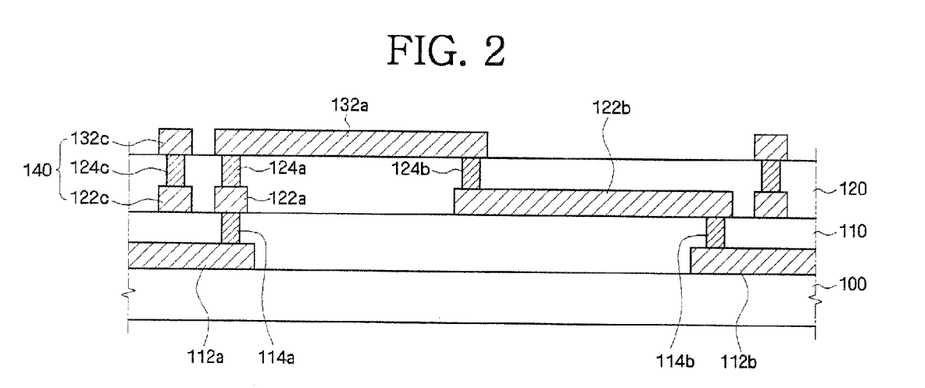
FIG. 2 is a sectional view of the semiconductor device shown in FIG. 1, taken along the line II-II'.
Figure 3:
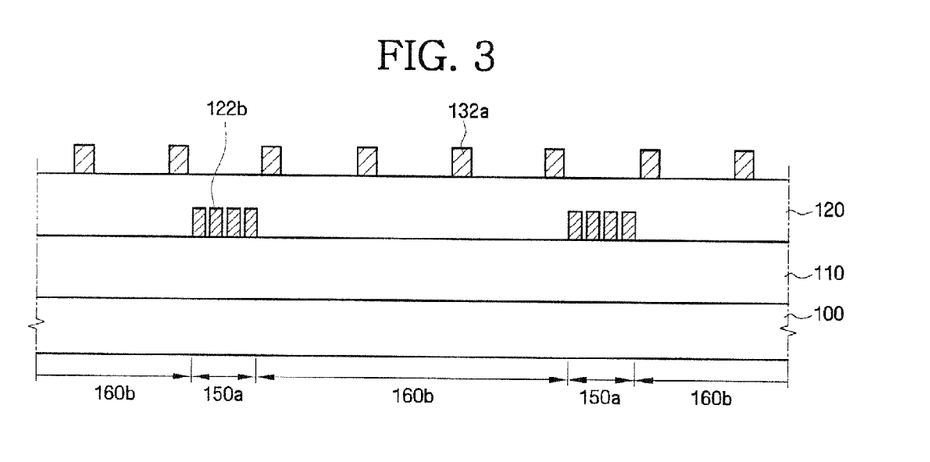
FIG. 3 is a sectional view of the semiconductor device shown in FIG. 1, taken along the line III-III'.

As shown in FIGS. 1 to 3, ends of wires 112*a* and 112*b* connected to semiconductor devices (not shown) are formed on a fuse region of a substrate 100 so as to face each other. The wires 112*a* and 112*b* are spaced apart from each other at a substantially regular interval and a first interlayer insulating film 110 is provided on the wires 112*a* and 112*b* to cover the wires 112*a* and 112*b*.

First and second runner parts 150*a* and 150*b* (collectively referred to herein as "runner parts") are spaced apart from each other by a regular interval. In one embodiment, the first and second runner parts 150*a* and 150*b* can be characterized as being arranged in two rows, wherein adjacent ones of the first runner parts 150*a* in one row are laterally separated from each other by a distance corresponding to a width of a second runner part 150*b* in the other row, and vice-versa (i.e., the first and second runner parts 150*a* and 150*b* are "transversely adjacent to each other").

Each runner part includes a plurality of runner lines 122*b* formed on the first interlayer insulating film 110. In one embodiment, the plurality of runner lines 122*b* may be provided at the same level. In another embodiment, the plurality of runner lines 122*b* may be formed from the same layer. In another embodiment, the plurality of runner lines 122*b* may be spaced apart from each other by a regular interval.

Ends of the runner lines 122*b* are connected to the wires 112*a* and 112*b* via contacts 114*a* and 114*b*. For example, runner lines 122*b* included in the first runner part 150*a* are connected to the wires 112*b* via contacts 114*b* and runner lines 122*b* included in the second runner parts 150*b* are connected to the wires 112*a* via contacts 114*a*. In one embodiment, the wires 112*a* and 112*b* may be formed under a portion of the first interlayer insulating film 110 between the runner parts 150*a* and 150*b*. In another embodiment, the wires 112*a* and 112*b* may be connected to pads 122*a* formed on the same layer as the runner lines 122*b*.

As illustrated, the runner lines 122*b* in the runner parts 150*a* and 150*b* are arranged at a narrower interval than the wires 112*a* and 112*b*. Thus, ends of the runner lines 122*b* that are connected to the wires 112*a* and 112*b* are bent. Ends of the runner lines 122*b* that are not connected to the wires 112*a* and 112*b* are bent so as to be connected to fuse lines 132*a* to be formed thereabove. The runner lines 122*b* in the runner parts 150*a* and 150*b* are separated by a minimum distance.

A second interlayer insulating film 120 is formed on the first and second runner parts 150*a* and 150*b*. Further, first and second fuse cut parts 160*a* and 160*b* (collectively referred to herein as "fuse cut parts") are formed on the second interlayer insulating film 120. In one embodiment, the first and second fuse cut parts 160*a* and 160*b* can be characterized as being arranged in two rows, wherein adjacent ones of the first fuse cut parts 160*a* in one row are laterally separated from each other by a distance corresponding to a width of a second fuse cut part 160*b* in the other row, and vice-versa (i.e., the first and second fuse cut parts 160*a* and 160*b* are "transversely adjacent to each other"). In another embodiment, the first and second fuse cut parts 160*a* and 160*b* may be laterally between the runner parts 150*a* and 150*b*. For example, each first fuse cut part 160*a* may be positioned laterally between second runner parts 150*b*, and each second fuse cut part 160*b* may be positioned between first runner parts 150*a*.

Each fuse cut part includes a plurality of fuse lines 132*a* formed on the second interlayer insulating film 120. In one embodiment, the plurality of plurality of fuse lines 132*a* may be provided at the same level. In another embodiment, the plurality of fuse lines 132*a* may be formed from the same layer. In another embodiment, the plurality of fuse lines 132*a* may be spaced apart from each other by a regular interval. In another embodiment, the fuse lines 132*a* in the fuse cut parts 160*a* and 160*b* may be spaced apart from each other by an interval greater than that by which the runner lines 122*b* are spaced apart. In another embodiment, the fuse cut parts 160*a* and 160*b* may be spaced apart from each other at the same interval as the fuse lines 132*a* therein. Accordingly, the fuse lines 132*a* may be formed so that the interval between the fuse lines 132*a* is a pitch corresponding to a maximum design rule.

In one embodiment, each fuse line 132*a* extends along substantially the same direction as the runner lines 122*b* positioned therebelow. Furthermore, a first end of each fuse line 132*a* is connected through a conductive via 124*b* to a corresponding runner line 122*b*, and a second end of each fuse line 132*a* is connected through a conductive via 124*a* and a contact 114*a* to the wires 112*a* and 112*b* formed on the substrate 100. For example, first ends of the fuse lines 132*a* in the first fuse cut parts 160*a* are connected through the conductive vias 124*b* to the runner lines 122*b* in the first runner parts 150*a* while the second ends of the fuse lines 132*a*, which are not connected to the runner line 122*b*, are connected through the conductive vias 124*a* to the pads 122*a* formed on the first interlayer insulating film 110. Accordingly, the second ends are connected to the wires 112*a* on the substrate 100. The fuse lines 132*a* of the second fuse cut parts 160*b* are connected to the wires 112*b* in the same manner.

Figure 7A:
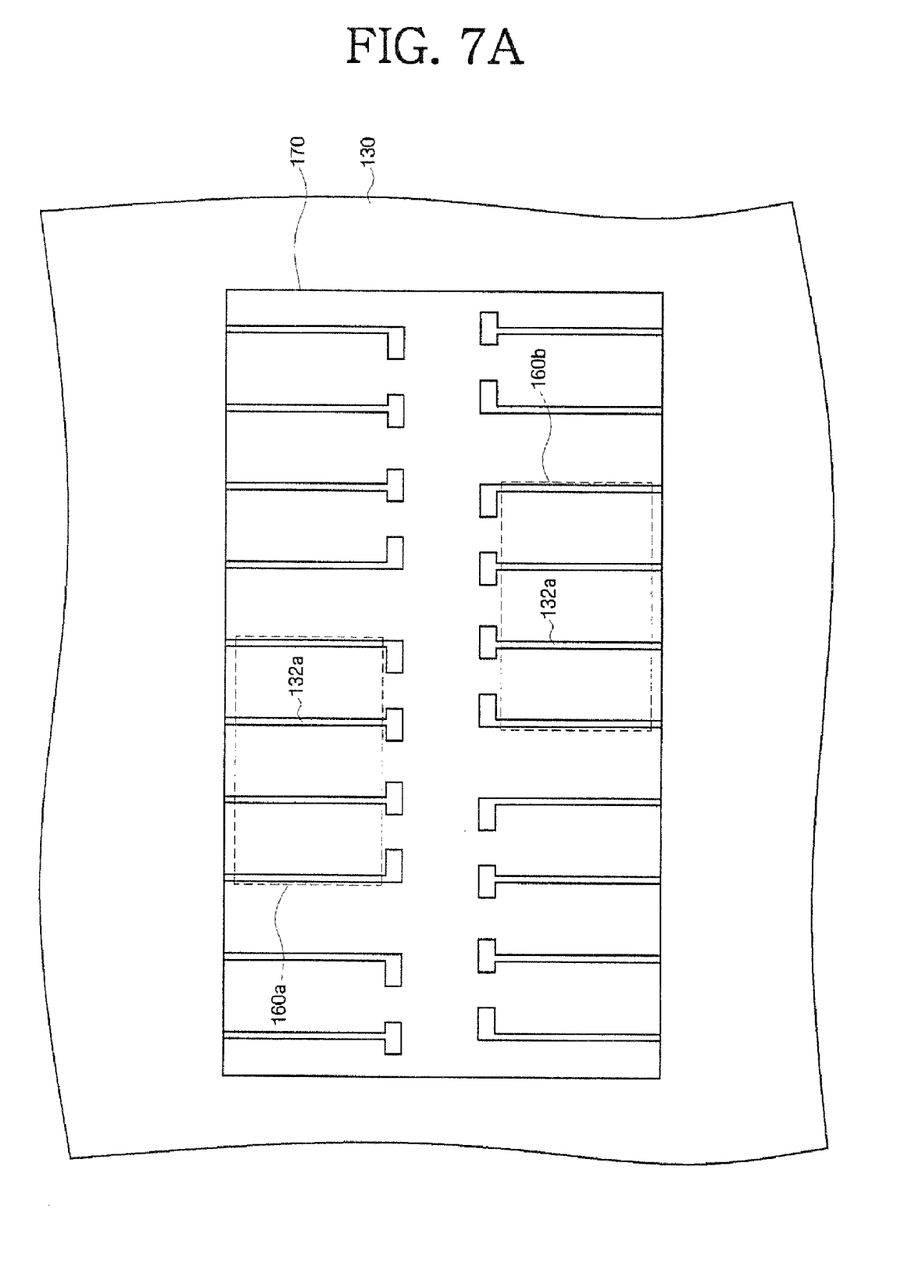
Figure 7B:
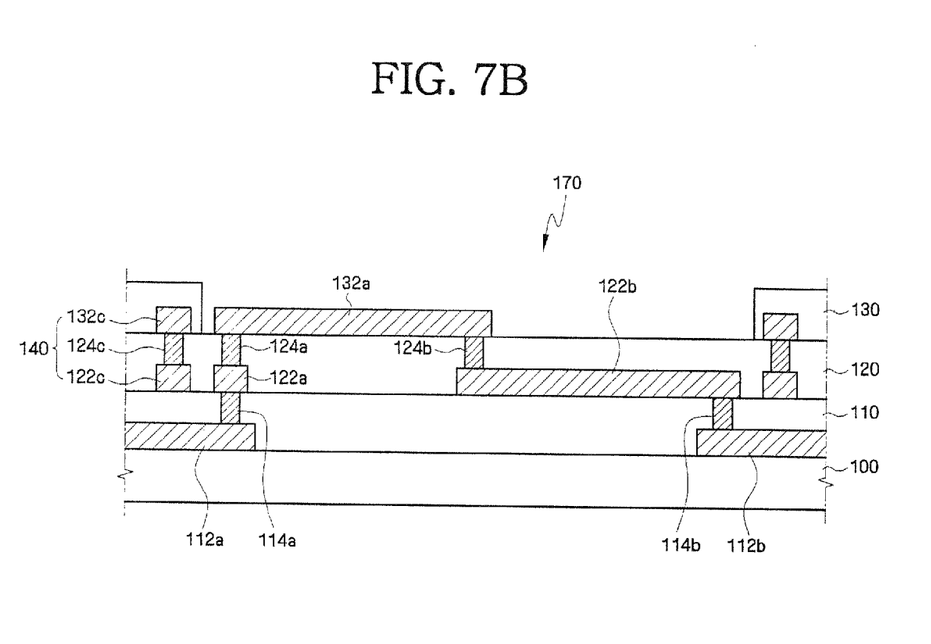

In one embodiment, as exemplarily shown in FIGS. 7A and 7B, a passivation film 130 may be formed on the second interlayer insulating film 120 so as to cover a guard ring pattern 132*c*, and a fuse window 170 may be formed through the passivation film 130 to expose the fuse cut parts 160*a* and 160*b*. Hence, the fuse lines 132*a* which are formed so as to have wide pitches are exposed through the fuse window 170.

As described above, the runner lines 122*b*, which are connected to the fuse lines 132*a*, are formed beneath the second interlayer insulating film 120 and under the fuse lines 132*a* so as to prevent fragments from being dispersed thereon if the fuse lines 132*a* are eventually cut. Furthermore, the runner lines 122*b* are formed under the fuse lines 132*a* so that the pitch between the fuse lines 132*a* can be set according to a maximum design rule. Hence, it is possible to prevent damage to the fuse lines 132*a* that are adjacent to the cut fuse lines 132*a* if fuse lines 132*a* are eventually cut.

Hereinafter, an exemplary method of manufacturing the semiconductor device exemplarily shown in FIGS. 1-3 will now be described with reference to FIGS. 4A to 7B.

FIGS. 4A, 5A, 6A, and 7A are plan views showing one embodiment of a method of manufacturing of a semiconductor device. FIGS. 4B, 5B, 6B, and 7B are cross-sectional views showing one embodiment of a method of manufacturing of a semiconductor device.

Figure 4A:
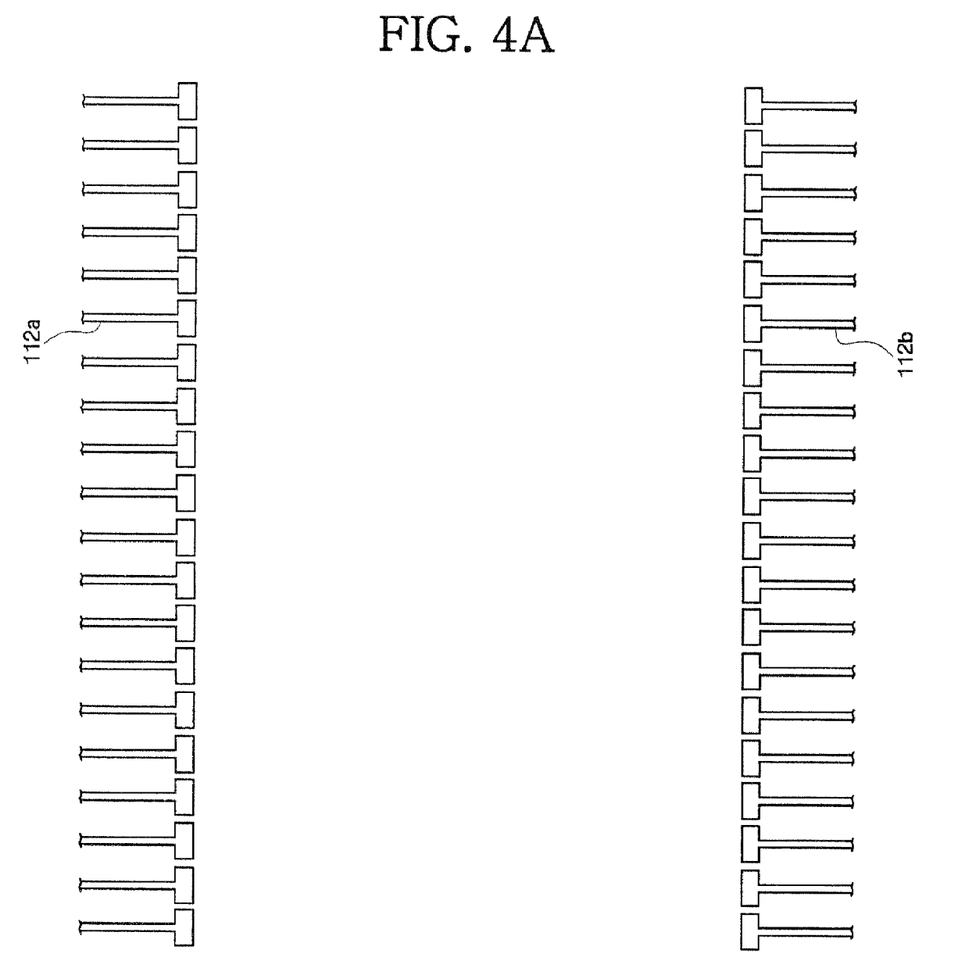
FIGS. 4A, 5A, 6A, and 7A are plan views showing one embodiment of a method of manufacturing of a semiconductor device.
Figure 4B:
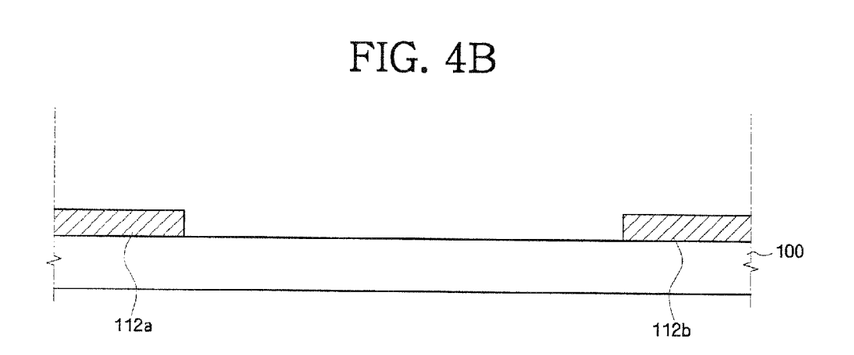
FIGS. 4B, 5B, 6B, and 7B are cross-sectional views showing one embodiment of a method of manufacturing of a semiconductor device.

As shown in FIGS. 4A and 4B, a conductive material is deposited on a substrate 100 and is subsequently patterned to form wires 112*a* and 112*b* that are spaced apart from each other by a regular interval. Ends of the transversely arranged wires 112*a* and 112*b* may be formed so as to face each other within a fuse region of the substrate 100.

Figure 5A:
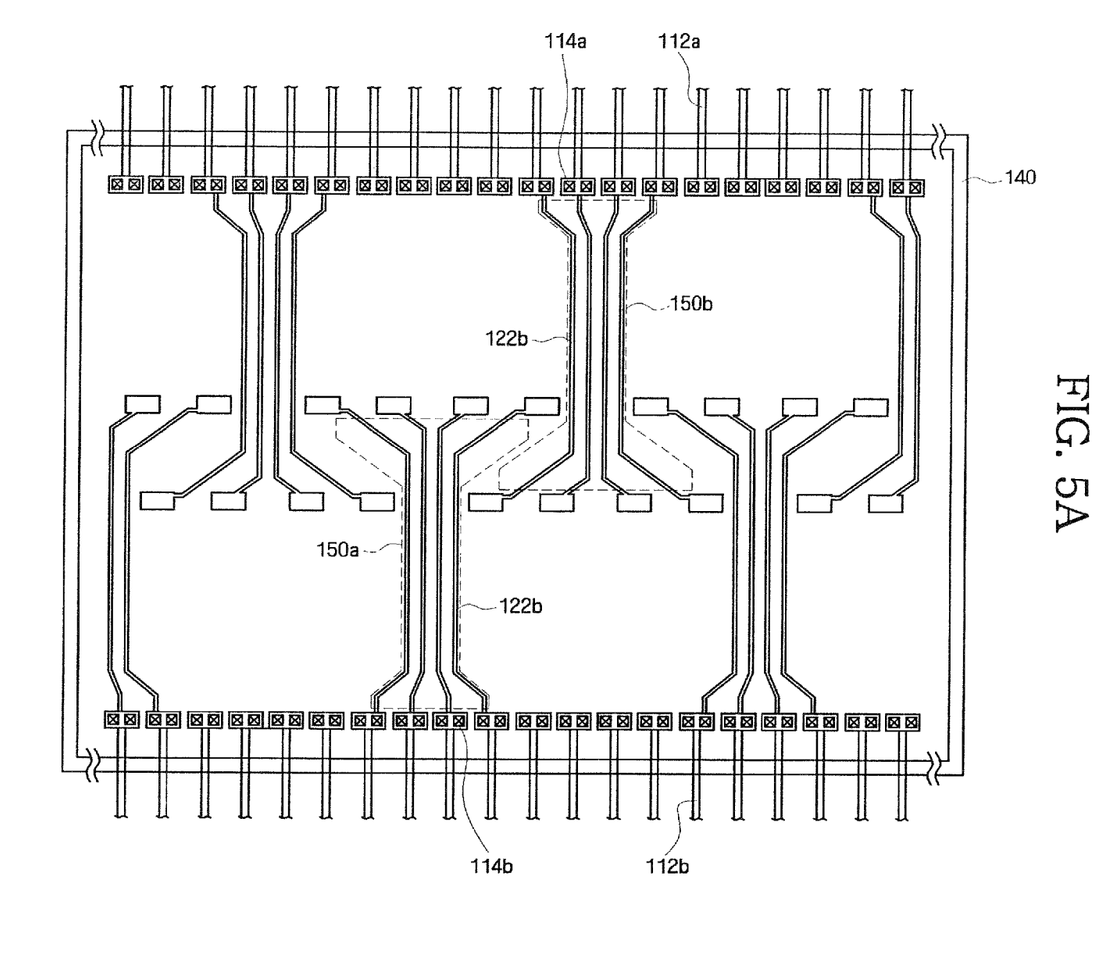
Figure 5B:
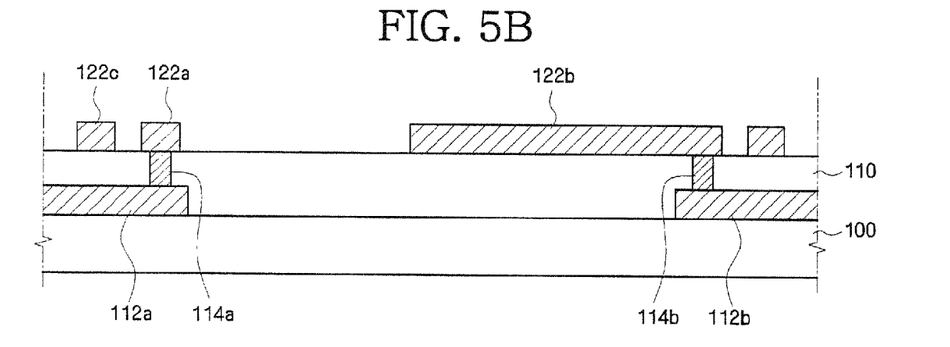

Next, as shown in FIGS. 5A and 5B, the first interlayer insulating film 110 is formed on the substrate 100 and on the wires 112*a* and 112*b* by depositing an insulating material over the substrate 100 and planarizing the insulating material. For example, the first interlayer insulating film 110 may include BSG (borosilicate glass), PSG (phosphosilicate glass), BPSG (borophosphosilicate glass), USG (undoped silicate glass), TEOS (tetraethylorthosilicate glass), O3-TEOS, or PE (plasma enhanced)-TEOS, or the like, or combinations thereof.

Next, contacts 114*a* and 114*b* are formed in the first interlayer insulating film 110 so as to be connected to the wires 112*a* and 112*b*, respectively. The contacts 114*a* and 114*b* may be formed, for example, by partially etching the first interlayer insulating film 110 to form contact holes therethrough, exposing ends of the wires 112*a* and 112*b*. Next, a conductive material may be deposited within the contact holes therein and a planarizing process (e.g., etch back or chemical mechanical polishing (CMP)) process may be conducted to complete formation of the contacts 114*a* and 114*b*.

Subsequently, a conductive material is deposited on the first interlayer insulating film 110 and is subsequently patterned to form the runner lines 122*b* of the runner parts 150*a* and 150*b* such that a plurality of runner lines 122*b* are spaced apart from each other by a regular interval within the runner parts 150*a* and 150*b*. In one embodiment, patterning may be conducted such that an end of each runner line 122*b* connected to a wire 112*a* or 112*b* is bent. In another embodiment, patterning may be conducted such that an end of each runner line 122*b* not connected to a wire 112*a* or 112*b* is bent.

Since the runner parts 150*a* and 150*b* are spaced apart from each other, the pad 122*a* is formed on the contact 114*a* which is not connected to the end of a runner line 122*b*. Accordingly, the pad 122*a* has the same thickness as the runner line 122*b* when the runner line 122*b* is formed.

In addition, a guard ring pattern 122*c* may be formed on the wires 112*a* and 112*b* along with the runner lines 122*b* so as to define a fuse region.

According to numerous embodiments, the runner line 122*b*, the pad 122*a*, and the guard ring pattern 122*c* may include a material such as polysilicon doped with impurities, a metal material such as tungsten, aluminum, or titanium, a metal compound such as titanium nitride or tungsten silicide, or the like or combinations thereof.

Figure 6A:
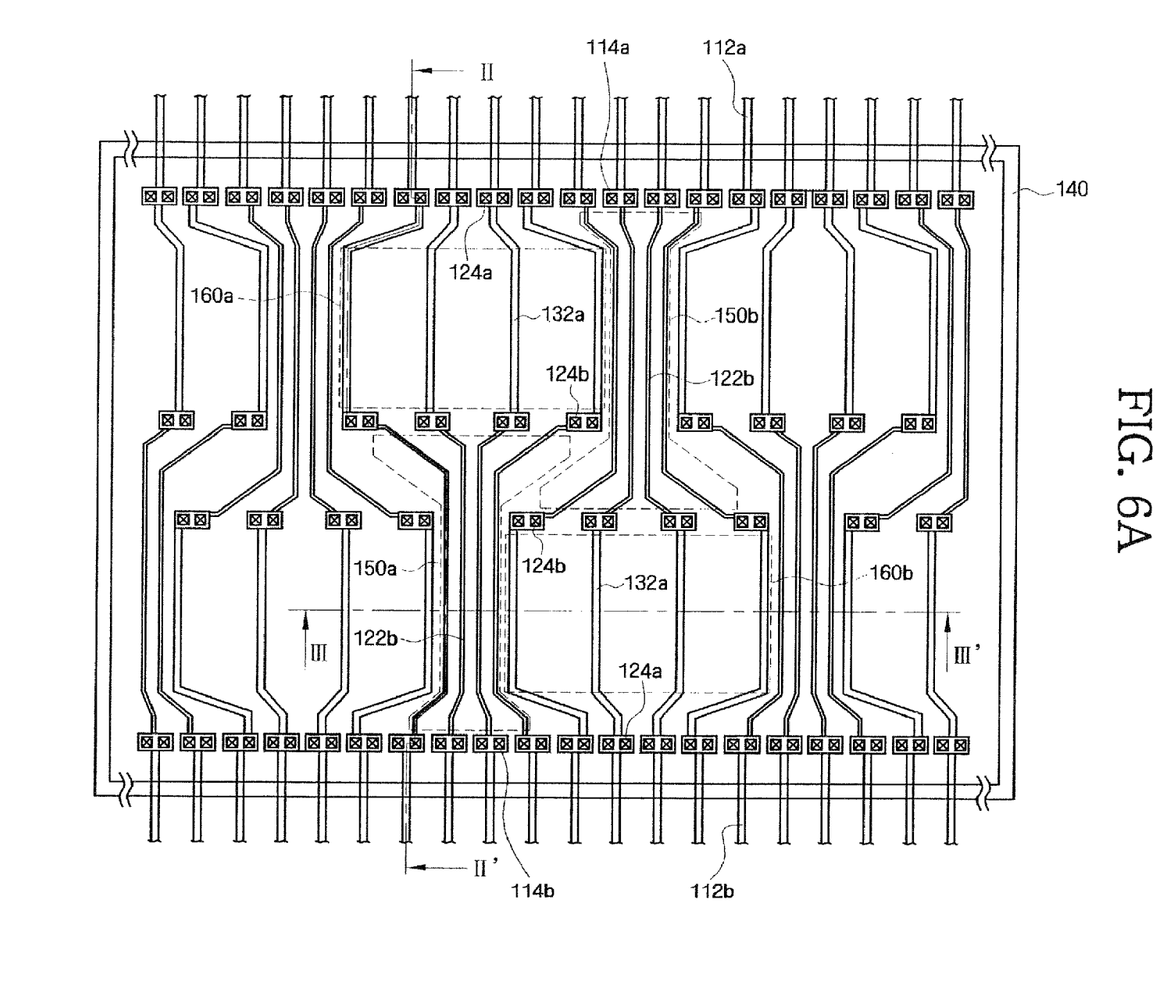
Figure 6B:
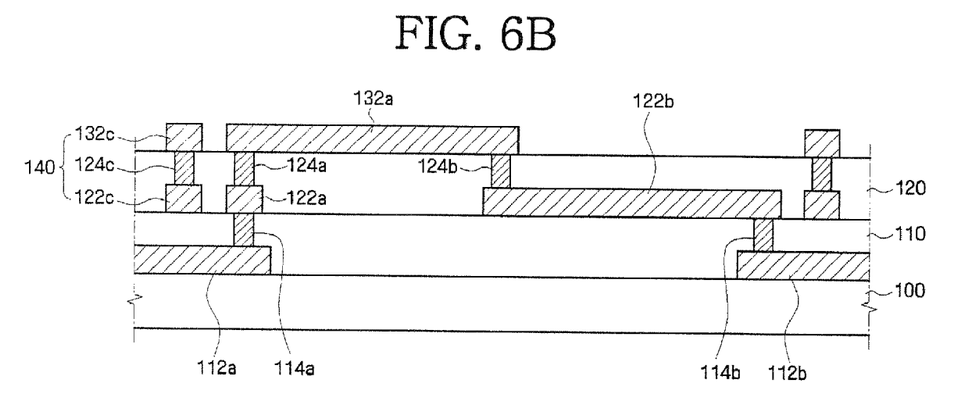

Next, as shown in FIGS. 6A and 6B, an insulating material is deposited on the entire surface of the first interlayer insulating film 110 and planarized to form the second interlayer insulating film 120. The second interlayer insulating film 120 may be partially etched to form via holes through which the pad 122*a* and an end of the runner line 122*b* under the second interlayer insulating film 120 are exposed. Another end of the runner line 122*b*, connected to the contact 114*b*, is also exposed. While the via holes are formed, guard ring contact holes are also formed to expose portions of the guard ring pattern 122*c*. A conductive material is deposited to fill the via holes and the guard ring contact holes and flattened to form the conductive vias 124*a* and 124*b* and the guard ring contacts 124*c*. Subsequently, the conductive material is deposited on the second interlayer insulating film 120 and patterned to form the fuse lines 132*a* connected to the conductive vias 124*a* and 124*b* and the guard ring pattern 122*c*.

In one embodiment, the fuse lines 132*a* and the guard ring pattern 122*c* may include polysilicon doped with impurities, a metal material such as tungsten, aluminum, or titanium, a metal compound such as titanium nitride or tungsten silicide, or the like, or combinations thereof.

Furthermore, an end of each fuse line 132*a* is connected through the conductive via 124*b* to the end of the runner line 122*b* and another end of each fuse line 132*a* is connected through the conductive via 124*b* and the pad 122*a* to the wires 112*a* and 112*b*. Additionally, the fuse lines 132*a* are spaced apart from each other at wider intervals than the runner lines 122*b*. The fuse lines 132*a* may constitute fuse cut parts 160*a* and 160*b*, and the fuse cut parts 160*a* and 160*b* are provided on a portion of the second interlayer insulating film 120 between the runner parts 150*a* and 150*b*. In addition, the fuse cut parts 160*a* and 160*b* are formed so that the interval between the fuse cut parts 160*a* and 160*b* is the same as the interval between the fuse lines 132 in the fuse cut parts 160*a* and 160*b*.

As described above, while the fuse line 132*a* is formed, a guard ring pattern 132*c* may also be formed to be connected to the guard ring contact 124*c*. Accordingly, a guard ring 140 comprising the guard ring pattern 122*c*, the guard ring contact 124*c* and the guard ring pattern 132*c*, is created to define the fuse region and prevent moisture from penetrating a semiconductor device during a repair process.

Next, as shown in FIGS. 7A and 7B, a passivation film 130 is formed on the second interlayer insulating film 120, and a photosensitive film pattern (not shown) is formed to expose the fuse cut parts 160*a* and 160*b* positioned therebelow. The passivation film 130 is then etched using the photosensitive film pattern (not shown) as an etch mask to expose the fuse cut parts 160*a* and 160*b*, thereby forming the fuse window 170. Hence, the fuse lines 132*a* which are formed so as to have wide pitches are exposed through the fuse window 170.

Although embodiments of the present invention have been exemplarily described above, it will be apparent to those skilled in the art that various modifications and changes may be made thereto without departing from the scope and spirit of the invention. Therefore, it should be understood that the above embodiments are not limitative, but illustrative in all aspects.

As described above, in a semiconductor device and a method of manufacturing the same according to the invention, runner lines which are connected to fuse lines are formed on a lower interlayer insulating film so as to increase a pitch between the fuse lines. Therefore, when the fuse lines are cut, it is possible to prevent the fuse lines that are adjacent to the cut fuse lines from being damaged by a laser beam.

Furthermore, since the runner lines are provided under the fuse lines, it is possible to prevent an electric short-circuit of the runner lines, which are arranged so as to have small pitches, caused by dispersion of fragments when the fuse lines are cut.

What is claimed is:
1. A semiconductor device comprising:
an interlayer insulating film on a substrate;

a plurality of wires on the substrate;

a dielectric material on the plurality of wires;

a runner part under the interlayer insulating film, the runner part including a plurality of runner lines spaced apart from each other by a first interval;

a plurality of conductive contacts extending through the dielectric material, wherein each of the plurality of runner lines is connected to a corresponding one of the plurality of wires by a conductive contact;

a fuse cut part on the interlayer insulating film, the fuse cut part including a plurality of fuse lines spaced apart from each other by a second interval greater than the first interval; and a conductive via connecting one of the plurality of fuse lines to a corresponding one of the plurality of runner lines through the interlayer insulating film, wherein the runner part and the fuse cut part do not overlap in a vertical direction.

2. The semiconductor device of claim 1, further comprising a plurality of fuse cut parts, wherein the runner part is between adjacent fuse cut parts.

3. The semiconductor device of claim 2, wherein an interval between the fuse cut parts is the substantially same as the second interval.

4. The semiconductor device of claim 1, wherein the fuse lines comprise a metal, a metal compound, polysilicon, or combinations thereof.

5. The semiconductor device of claim 1, wherein a runner line comprises a bent end.

6. The semiconductor device of claim 1, wherein the plurality of fuse lines are separated by a pitch corresponding to a maximum design rule.

7. The semiconductor device of claim 1, wherein a fuse line and a runner line extend along substantially the same direction over the substrate.

8. The semiconductor device of claim 1, wherein the plurality of wires are spaced apart from each other along the first direction by a third interval greater than the first interval.

9. A semiconductor device comprising:

an interlayer insulating film on a substrate;

a plurality of wires on the substrate;

a dielectric material on the plurality of wires;

a first runner part under the interlayer insulating film and a second runner part adjacent to the first runner part, the first and second runner parts including a plurality of runner lines spaced apart from each other by a first interval;

a plurality of conductive contacts extending through the dielectric material, wherein each of the plurality of runner lines is connected to a corresponding one of the plurality of wires by a conductive contact;

a first fuse cut part on the interlayer insulating film and a second fuse cut part adjacent to the first fuse cut part, the first and second fuse cut parts including a plurality of fuse lines spaced apart from each other by a second interval greater than the first interval; and a conductive via connecting one of the plurality of fuse lines to a corresponding one of the plurality of runner lines through the interlayer insulating film, wherein the first and second runner parts and the first and second fuse cut parts do not overlap in a vertical direction.

10. The semiconductor device of claim 9, wherein an interval between the first and second fuse cut parts is substantially the same as the second interval.

11. The semiconductor device of claim 9, wherein the fuse lines comprise a metal, a metal compound, polysilicon, or combinations thereof.

12. The semiconductor device of claim 9, wherein a runner line comprises a bent end.

13. The semiconductor device of claim 9, wherein the plurality of fuse lines are separated by a pitch corresponding to a maximum design rule.

14. The semiconductor device of claim 9, wherein a fuse line and a runner line extend along substantially the same direction over the substrate.

15. A semiconductor device comprising:

an interlayer insulating film on a substrate;

a plurality of runner lines under the interlayer insulating film and spaced apart from each other along a first direction by a first interval;

a plurality of fuse lines on the interlayer insulating film and spaced apart from each other along the first direction by a second interval greater than the first interval; and a plurality of conductive vias extending through the interlayer insulating film, wherein each of the runner lines is connected to a corresponding one of the plurality of fuse lines by a conductive via.

* * * * *